United States Patent [19] [11] 3,911,463
Hull, Jr. et al. [45] Oct. 7, 1975

[54] PLANAR UNIJUNCTION TRANSISTOR

[75] Inventors: Clifford O. Hull, Jr., Baldwinsville; Leland F. Leinweber, Dewitt; William H. Sahm, III, Syracuse; James W. Sprague, Clay, all of N.Y.

[73] Assignee: General Electric Company, Syracuse, N.Y.

[22] Filed: Jan. 7, 1974

[21] Appl. No.: 431,055

[52] U.S. Cl. ...................... 357/21; 357/36; 357/67; 357/86
[51] Int. Cl.[2] .................... H01L 29/08; H01L 29/74
[58] Field of Search .......................... 357/21, 35, 36

[56] References Cited

UNITED STATES PATENTS

| | | | |
|---|---|---|---|
| 3,302,076 | 1/1967 | Kang et al. | 357/53 |
| 3,405,329 | 10/1968 | Loro et al. | 357/53 |
| 3,436,617 | 4/1969 | Farrar et al. | 357/21 |
| 3,463,977 | 8/1969 | Grove et al. | 357/53 |
| 3,601,668 | 8/1971 | Slaten et al. | 357/53 |
| 3,617,828 | 11/1971 | Daniluk | 357/21 |

*Primary Examiner*—William D. Larkins
*Attorney, Agent, or Firm*—R. J. Mooney; D. E. Stoner

[57] ABSTRACT

Disclosed is a semiconductor device comprising a body of semiconductor material that defines two major surfaces and is generally of a first type of conductivity. Formed in the body adjacent one of the major surfaces is a base one region that exhibits the first conductivity type but has a lower resistivity than the resistivity of the body. Also formed in the body adjacent the first surface and at varying distances from the base one region are several emitter regions that exhibit a second type of conductivity. A restraining region is formed in the body contiguous with the base one region at least on the sides thereof nearest the several emitter regions. The restraining region exhibits the second type of conductivity and prevents the spreading of the base one region in the direction of the emitter regions. The portion of the body adjacent the second major surface forms a base two region. Appropriate contacts are provided to connect the semiconductor device to an external circuit. Following fabrication, the device is tested and the emitter region that provides the desired device characteristics is chosen as the emitter for the finished device. In a preferred embodiment disclosed herein the major surface adjacent the base one and emitter contacts is covered with a thin insulative layer and a metallic field relief electrode overlies a portion of that layer between the base one region from the several emitter contacts. Biasing for the field relief plate is provided by extending the plate to a point near the periphery of the major surface upon which it lies and establishing ohmic contact between the semiconductor body near the periphery of the surface and the field relief plate.

12 Claims, 4 Drawing Figures

PLANAR UNIJUNCTION TRANSISTOR

BACKGROUND OF THE INVENTION

This invention relates to unijunction transistors and, more particularly, to a unijunction transistor design that can be fabricated at low cost and is conducive to high manufacturing yield.

Conventional unijunction transistors are fabricated from bodies of semiconductive material exhibiting a given type of conductivity. A base one region is formed in the body which exhibits the given type of conductivity but is more heavily doped than the remainder of the body and thus exhibits a lower resistivity. Also formed in the body is an emitter region that exhibits a conductivity of a type opposite the given type. Base one and emitter contacts are affixed to the body so as to make electrical contacts with the base one and emitter regions respectively. A base two contact is affixed elsewhere on the body so as to make electrical contact with a base two region of the body. The devices are generally biased with one base connected to a high potential, the other base connected to a low potential and the emitter connected to an intermediate potential. Thus, the PN junction formed between the emitter region and the remainder of the body may be forward biased inasmuch as one base exhibits a higher potential than the emitter region and one base exhibits a lower potential. The total base-to-base resistance and emitter-to-base voltage, among other characteristics, vary in response to different emitter currents. If more information on the structure and application of conventional unijunction transistors is desired, reference is made to such commonly available publications as the Transistor Manual, published by the General Electric Company.

Two unijunction transistor designs were originally manufactured. These designs are the well-known bar and cube structures, which are also described in the Transistor Manual. While the bar and cube structures provide devices with excellent electrical characteristics and manufacturing yield is good, they do not lend themselves to high volume production. Consequently, a design that could be manufactured less expensively and in high volume was sought. A planar design utilizing a large wafer to fabricate many devices was tested, but it was initially found that the manufacturing yield was unacceptably low. The cause of the low manufacturing yield was found to be that the spacing between the emitter and the base one is very critical in a planar design. Consequently a design was settled upon that includes a plurality of base ones. Following wafer fabrication, tests are performed to determine which of the base ones function most efficiently. Following that determination, a permanent connection is made to the selected base one and the other base ones are unused. Through this approach a planar unijunction transistor design became commercially feasible.

A problem associated with unijunction transistors of any of the aforementioned structures which sometimes causes devices to fail in particular applications was found to be a "spreading" of the base one. Under certain electrical stresses the effective area of the base one can spread into the body of the semiconductor material with a resultant change in the effective base one-to-emitter spacing. This is facilitated inasmuch as the base one region is of the same conductivity type as the body and thus no PN junction exists therebetween. A solution that was found to alleviate the problem of base one spreading is to diffuse into the body, so as to at least partially surround the base one, a restraining region of the opposite conductivity type from the base one. Thus, the base one is partially defined by a PN junction and spreading is inhibited. This approach is fully described in U.S. Pat. No. 3,617,828 issued to Samyon E. Daniluk.

In view of the above it seemed that a unijunction transistor with excellent electrical properties could be inexpensively manufactured by utilizing the aforementioned planar design and incorporating the restraining regions around each of the bases. Several such devices were fabricated. However, the electrical properties of the resulting devices were not good. Upon close electrical testing it was found that the devices did not function as suitable unijunction transistors. The reason for the incompatibility between the multiple base one planar design and the incorporation of the restraining regions appears related to the presence of an excessive number of PN junctions in the device created by the restraining regions that are placed around each base one. Due to the excessive number of junctions we believe that the device begins to behave more in the manner of a conventional transistor than a unijunction transistor. This theory was borne out by electrical testing.

It is an object of this invention, therefore, to provide a planar unijunction transistor with good electrical properties, that is conducive to high manufacturing yield and includes a restraining region for device stability under widely varying electrical stresses.

SUMMARY OF THE INVENTION

This invention is characterized by a semiconductor device comprising a body of semiconductive material that defines two major surfaces and exhibits a first conductivity type. A base one region is formed in the body adjacent one of the major surfaces. The base one region exhibits the first conductivity type but is of a lower resistivity than the bulk of the body. A plurality of emitter regions of a second conductivity type are formed in the body adjacent the one major surface, each of the emitter regions being a different distance from the base one region. A restraining region of the second conductivity type is formed in the body adjacent the one major surface and contiguous with the base one region and situated between the base one region and the emitter region. The restraining region prevents the spreading of the base one region in the direction of the emitter regions during operation of the device as a unijunction transistor. A portion of the body of semiconductor material, as for example the portion adjacent the second major surface, functions as a base two region. Electrical contacts are affixed to the body of semiconductor material so that external electrical connections can be made to the base regions and each of the emitter regions. The base one contact region overlaps at least a portion of the restraining region so that the PN junction between the base one region and the restraining region is shorted near the first major surface. Following attachment of the contacts, electrical testing is performed to determine which of the several emitter regions provides the most attractive electrical characteristics and then a permanent coupling is made to the corresponding emitter contact. Consequently, it will be appreciated that there has been provided a planar unijunction transistor including a restraining region for preventing the spreading of the base one region. Furthermore, high manufacturing yield is promoted inasmuch as the several emitter regions facilitate optimization of device characteristics after pellet manufacture. A further advantage of this configuration is that overall manufacturing costs are further reduced inasmuch as similar planar bodies can be manufactured and utilizing one emitter region in some will provide devices with a given set of characteristics and utilizing a different emitter region in others will provide devices with a different set of characteristics. Thus, common manufacturing facilities, techniques and equipment can be used to provide devices with differing characteristics.

A feature of the subject invention is the inclusion of a field relief plate disposed over a thin insulative layer on the first major surface. The field relief plate passes between the base one region and the several emitter regions. This plate is biased to prevent spreading of the emitter toward base one. A particular advantage of the field relief plate as described is that it is biased by connection to the semiconductor body at a point remote from the base one and emitter regions in a manner that will be described more fully below. Thus, the completed transistor is a three-terminal device. A conventional field relief plate would require a separate lead thereto for proper bias.

DESCRIPTION OF THE DRAWINGS

These and other features and objects of the present invention will become more apparent upon a perusal of the following description taken in conjunction with the accompanying drawings wherein.

DESCRIPTION OF THE PREFERRED EMBODIMENT

Figure 1:
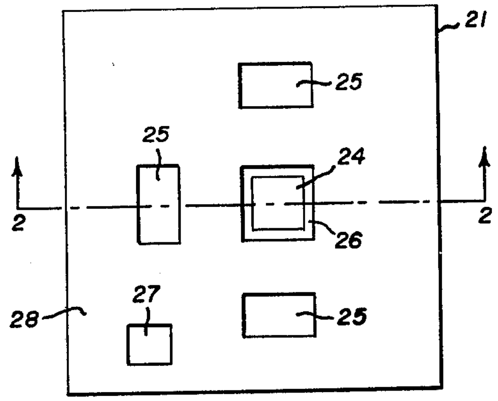
FIG. 1 is a plan view of a pellet of semiconductor material that has been diffused to form the active element of the subject planar unijunction transistor.
Figure 2:
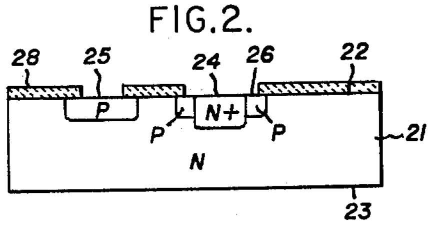
FIG. 2 is a sectional elevation view of the pellet depicted in FIG. 1.
Figure 3:
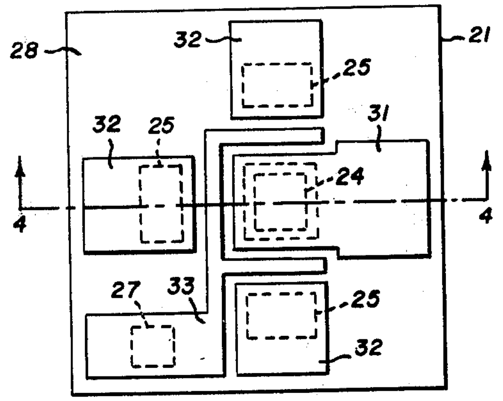
FIG. 3 is a plan view of the pellet shown in FIGS. 1 and 2 following metallization.
Figure 4:
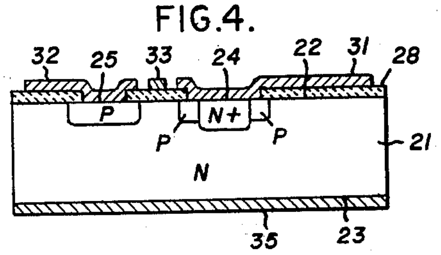
FIG. 4 is an elevation view of the pellet depicted in FIG. 3.

Referring first to FIGS. 1 and 2 there is shown a body 21 of semiconductor material that defines two major surfaces 22 and 23 that are generally parallel. The bulk of the body 21 exhibits a first conductivity type, such as N conductivity. For example, the body can be phosphorous or arsenic doped silicon. It should be appreciated that the body 21 is a single pellet that is but a portion of a larger semiconductor wafer. The subject unijunction transistor structure lends itself to the simultaneous manufacture of many devices on a single wafer. Only a pellet is shown in order to promote clarity in the FIGURES. It should be understood that in the manufacture of the devices as many as thousands are manufactured simultaneously on a single wafer.

First, the body 21 must be diffused with the pattern shown in FIGS. 1 and 2. The wafer is polished to remove surface impurities and a layer of oxide is grown over the first major surface 22. Two openings are formed in the oxide by conventional techniques such as photoresist masking and etching. The openings are to facilitate the formation of a base one region 24 and a field relief contact region 27. The positions of the openings are shown in FIG. 1. The base one region 24 and the contact region 27 are formed by diffusing an impurity into the body 21 such that these regions exhibit the first type of conductivity but have a lower resistivity than the bulk of the body 21. Thus, when the body consists of N type material, the base one region 24 and the contact region 27 will be diffused to be N+ with, for example, phosphorous. During the diffusion step all areas of the first major surface 22 except near the regions 24 and 27 are left oxide covered.

Following the above diffusion step the first major surface 22, including the base one region and contact region, is again covered with oxide. Portions of the new oxide coating are removed by conventional techniques to facilitate the formation of a plurality of emitter regions 25. The spacings between each emitter region 25 and the base one region 24 varies. Another portion of the oxide is removed to facilitate the formation of a closed loop restraining region 26 that is contiguous with the base one region 24. An impurity is then diffused into the body 21 so that the emitter regions 25 and the restraining region 26 are of a second conductivity type. In the example given above, the second conductivity type is, of course, P conductivity. Thus the dopant can be boron. Operation and function of the restraining region can be fully understood by reference to the aforementioned Daniluk Patent. If it is felt that stresses have developed in the body 21 an annealing step can be carried out.

Next, the oxide overlying the base one region 24 and the contact region 27 near the periphery of the first major surface 22 is removed. Following these oxide removal steps the body of semiconductor material 21 appears as shown in FIG. 1 with the base one region 24, the emitter regions 25, the contact region 27 and the restraining region 26 diffused therein. Furthermore, a thin insulative layer of oxide 28 covers the entire first major surface 22 with the exception of the portions adjacent the aforementioned regions.

Electrically coupling contacts must be applied to the device. The oxide 28 and, where exposed, the first major surface 22 is covered with a contact metal such as, for example, aluminum. The covering is made by conventional processes such as vapor deposition and sintering. Next, portions of the metal layer are selectively removed by such techniques as photoresist masking and etching. Following the selective removal of the metal there is left on the body 21 a base one contact 31 and a plurality of emitter contacts 32. It will be observed that the base one contact 31 shorts the PN junction between the base one region 24 and the restraining region 26 near the first major surface 22. Also remaining on the oxide layer 28 is a metallic field relief plate 33 that separates the base one contact 31 from the emitter contacts 32 and, through the contact region 27, makes ohmic contact with the body of semiconductor material 21.

A portion of the body 21 serves as a base two region. For example, the base two region may be the portion of the body 21 near the second major surface 23. A metallic base two coupling contact 35 thus must be applied to a substantial portion of the second major surface 23. To insure good ohmic contact a layer of gold containing a dopant of the first type, such as phosphorous or arsenic, is preferred as a base two contact 35. Prior to the application of the base two contact any oxide on the second major surface 23 is preferably removed. It has been found advantageous to utilize a doped gold preform for mounting the semiconductor body 21 on a header or other support to provide both mechanical support and electrical contact.

The device may then be tested by making temporary electrical connections to each of the several emitter contacts. After it is determined which of the several emitter regions 25 provides the most desirable electrical characteristics the body 21 is mounted, preferably with a doped gold preform. Next, a wire-lead is bonded to the selected emitter contact 32. A wire-lead is also bonded to the base one contact 31. Finally, the device is encapsulated in a conventional manner.

While it is not strictly necessary to include the field relief plate, it has been found beneficial inasmuch as biasing during operation depletes the vicinity of the major surface 22 of electrons. Thus an abundance of holes is left in the N-doped semiconductor body near the first major surface 22. A sufficient number of holes near the surface 22 between the base one region 24 and the emitter region 25 that is in use, can cause the N-type material to become "inverted". That is, the material begins to behave as if P doping were present. This causes an uncontrolled change in the effective base one emitter spacing. By applying a charge to the field relief plate 33 that is positive with respect to the first major surface 22, electrons are retained near the surface 22 and no spacing change occurs. That is, of course, well known in the prior art.

One feature of the subject field relief plate is that no separate biasing lead connected thereto is required. That is because it was discovered that points of the first major surface near the periphery thereof, such as the contact region 27, are sufficiently more positive than the interior regions thereof. That is because the contact region 27 is electrically "nearer" the second major surface 23 and relatively electrically "remote" from the active region around the base one region 24. Thus, providing ohmic contact between the field relief plate 33 and the body of semiconductor material 21 at the contact region 27 provides a slight but adequate positive bias on the relief plate.

In light of the above teachings, many modifications and variations of the subject invention will be apparent to those skilled in the art. For example, the restraining region 26 need not extend around the side of the base one region 24 opposite the emitter region 25. Or, the field relief plate 33, if included, can comprise the more conventional separate biasing lead or can be of many other configurations. It is to be understood, therefore, that the invention can be practiced in other ways than as specifically described.

What we claim as new and desire to secure by Letters Patent of the United States is:

1. A semiconductor device comprising:

a body of semiconductor material defining two major surfaces, said body exhibiting a first conductivity type;

a base one region formed in said body adjacent one of said major surfaces, said base one region being of the first conductivity type and exhibiting a lower resistivity than the resistivity of the bulk of said body;

a plurality of emitter regions formed in said body adjacent said one major surface, said emitter regions being of a second conductivity type and wherein the spacings between said emitter regions and said base one region are different;

a restraining region formed in said body adjacent said one major surface and contiguous with said base one region and situated between said base one region and said emitter regions, said restraining region being of the second conductivity type and restraining the spreading of said base one region during operation of said semiconductor device; and wherein a portion of said body comprises a base two region.

2. A semiconductor device according to claim 1 further comprising a metallic base two contact adjacent a substantial portion of the other one of said major surfaces, a plurality of metallic emitter contacts, one of said emitter contacts covering the portion of said one major surface that is contiguous with each of said emitter regions, and a metallic base one contact covering the portion of said one major surface adjacent said base one region and said restraining region thus electrically connecting said base one region and said restraining region.

3. A semiconductor device according to claim 1 further comprising coupling means for coupling said device to an external circuit, said coupling means comprising a base two coupling means in an electrically conductive relationship with said base two region, base one coupling means in an electrically conductive relationship with said base one region, and emitter coupling means in an electrically conductive relationship with at least one of said emitter regions.

4. A semiconductor device according to claim 3 wherein said base two region comprises the region of said body adjacent the other one of said major surfaces and said base two coupling means comprises a layer of gold with a dopant of the first type on said other major surface.

5. A semiconductor device according to claim 4 further comprising a thin layer of insulative material overlying substantially all portions of said one major surface except those portions contiguous with said base one region, said restraining region and said several emitter regions, said device further comprising a metallic field relief plate overlying said insulative material on the portions separating said base one region and said several emitter regions.

6. A semiconductor device according to claim 5 wherein said layer of insulative material comprises a layer of semiconductor oxide and wherein a portion of said field relief plate extends to a point near the periphery of said one major surface and contacts said one major surface at said point.

7. A semiconductor device according to claim 6 wherein said two major surfaces are substantially parallel.

8. A semiconductor device according to claim 6 wherein said first conductivity type is N conductivity and said second conductivity type is P conductivity.

9. A semiconductor device according to claim 6 wherein said restraining region is a closed loop and surrounds a portion of said base one region.

10. A semiconductor device according to claim 6 wherein said device comprises a unijunction transistor.

11. A semiconductor device according to claim 1 further comprising a thin layer of insulative material overlying substantially all portions of said one major surface except those portions contiguous with said base one region, said restraining region and said several emitter regions, said device further comprising a metallic field relief plate overlying said insulative material on the portions separating said base one region and said several emitter regions.

12. A semiconductor device according to claim 11 wherein said layer of insulative material comprises a layer of semiconductor oxide and wherein a portion of said field relief plate extends to a point near the periphery of said one major surface and contacts said one major surface at said point.

* * * * *